(12) United States Patent
Yokoi (10) Patent No.: US 8,258,630 B2
(45) Date of Patent: Sep. 4, 2012

(54) SEMICONDUCTOR DEVICE AND METHOD OF MANUFACTURING THE SAME

(75) Inventor: Naoki Yokoi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 140 days.

(21) Appl. No.: 12/605,504

(22) Filed: Oct. 26, 2009

(65) Prior Publication Data

US 2010/0102455 A1 Apr. 29, 2010

(30) Foreign Application Priority Data

Oct. 28, 2008 (JP) ................................. 2008-276484

(51) Int. Cl.
*H01L 23/48* (2006.01)
*H01L 23/52* (2006.01)
*H01L 29/40* (2006.01)

(52) U.S. Cl. ........................................ 257/758; 257/522
(58) Field of Classification Search .................. 257/276, 257/522, 758
See application file for complete search history.

(56) References Cited

U.S. PATENT DOCUMENTS

| 5,000,818 | A | * | 3/1991 | Thomas et al. | 438/619 |
| 6,245,658 | B1 | * | 6/2001 | Buynoski | 438/619 |
| 6,713,835 | B1 | * | 3/2004 | Horak et al. | 257/522 |
| 7,821,086 | B2 | * | 10/2010 | Kajiyama | 257/421 |
| 2004/0021227 | A1 | * | 2/2004 | Watanabe | 257/773 |
| 2006/0006547 | A1 | * | 1/2006 | Matsunaga | 257/774 |

FOREIGN PATENT DOCUMENTS

| JP | 2003-163264 | 6/2003 |
| JP | 2004-327909 | 11/2004 |

* cited by examiner

*Primary Examiner* — S. V Clark
(74) *Attorney, Agent, or Firm* — Young & Thompson (57) ABSTRACT

A semiconductor device includes: a first layer; a second layer above the first layer; first and second multi-layered structures; and a supporter. The first and second multi-layered structures extend from the first layer to connect to the second layer. The supporter extends from the first layer to connect to the second layer. The supporter is between the first and second multi-layered structures. The supporter is separated from the first and second multi-layered structures by empty space.

7 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. Particularly, the present invention relates to a semiconductor device having a multi-layered wiring structure including air-gaps, and a method of manufacturing the same.

Priority is claimed on Japanese Patent Application No. 2008-276484, filed Oct. 28, 2008, the content of which is incorporated herein by reference.

2. Description of the Related Art

Recently, semiconductor devices having a multi-layered wiring structure have been manufactured. Such a semiconductor device includes wires vertically and horizontally provided in each layer, contact plugs electrically and vertically connecting the wires in different layers, and an inter-layer low-permittivity film covering gaps among wiring portions for reducing capacities among the wires.

However, wires are densely provided, and wire intervals are small in recent years, causing an increase in a parasitic capacity affecting one wire and preventing high speed operation.

Various methods of reducing capacities among wires have been proposed. For example, Japanese Unexamined Patent Application, First Publication No. 2003-163264 discloses a copper interconnect of an air gap formed by: alternately forming wiring portions and inter-layer insulating films with the desired layout; and wet-etching the inter-layer insulating film made of a silicon oxide film to form gaps among the wiring portions. Instead of the inter-layer insulating film, gaps are provided among the wiring portions in this structure, thereby enabling a reduction in capacities among the wires. This structure is called an air-gap structure, an air isolation structure, or an air-gap isolation structure.

However, the wiring portions are supported only by contact plugs. For this reason, long wires that are longer than 1 mm, such as power supply wires, are used for upper wiring portions. The long wires sag under their own weight. Consequently, the sagged long wires contact other wires in a lower layer, thereby causing the upper and lower wires to short out, or the long wires to fracture.

Japanese Unexamined Patent Application, First Publication No. 2004-327909 discloses a semiconductor device having an air-gap structure including a support plug to prevent fracture of wires. However, the support plug is made of an insulating material different from the material forming the wires, thereby causing a complicated manufacturing process.

SUMMARY

In one embodiment, there is provided a semiconductor device that includes: a first layer; a second layer above the first layer; first and second multi-layered structures; and a supporter. The first and second multi-layered structures extend from the first layer to connect to the second layer. The supporter extends from the first layer to connect to the second layer. The supporter is between the first and second multi-layered structures. The supporter is separated from the first and second multi-layered structures by empty space.

Accordingly, a deflection of the second layer is reduced, thereby preventing the first and second layers from shorting, and the second layer from fracturing.

In another embodiment, there is provided a method of manufacturing a semiconductor device. The method includes the following processes. An insulating multi-layered structure including upper and bottom insulating layers is formed. The upper insulating layer includes an upper wiring portion to which first and second multi-layered structures and a supporter connect. The supporter is between the first and second multi-layered structures. The first and second multi-layered structures and the supporter extend from the bottom insulating layer. Then, the insulating multi-layered structure is selectively etched to have the first and second multi-layered structures and the supporter remain such that the supporter is separated from the first and second multi-layered structure by empty space.

Accordingly, the first and second multi-layered structures and the supporter can be simultaneously formed, thereby simplifying a method of manufacturing semiconductor devices.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
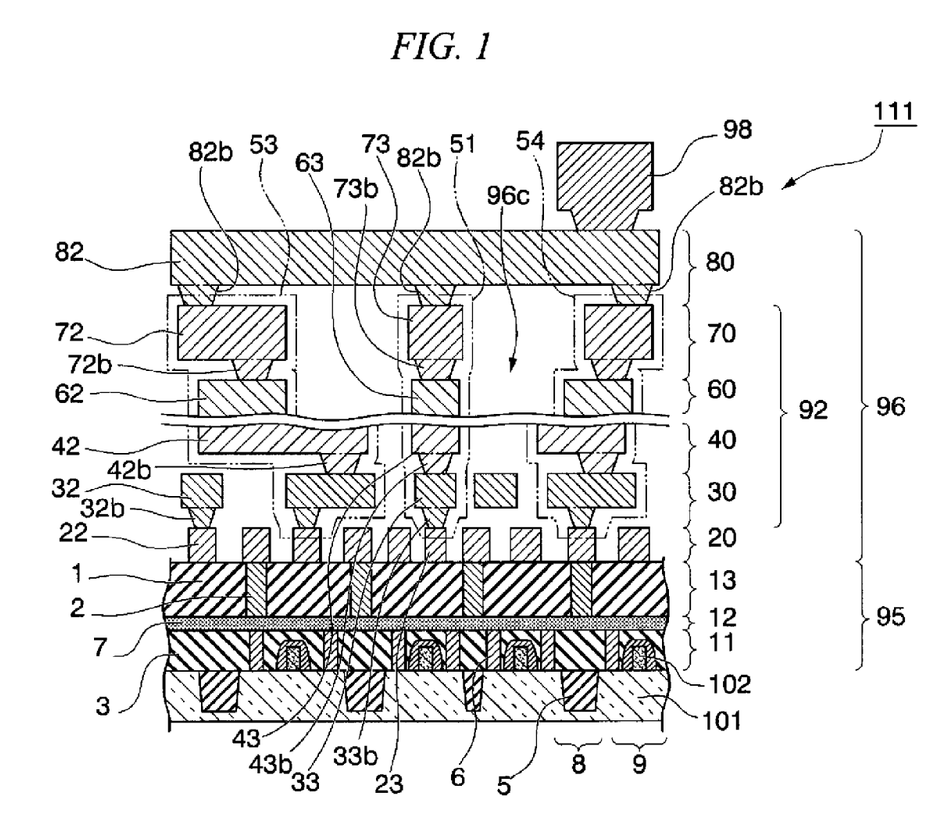
FIG. 1 is a cross-sectional view illustrating a semiconductor device according to a first embodiment of the present invention.

FIG. 1 is a cross-sectional view illustrating a semiconductor device 111 according to a first embodiment of the present invention. The semiconductor device 111 includes: an inter-layer film 95 and a multi-layered wiring portion 96 which are deposited on a silicon substrate 101 in this order; and a bonding pad 98 on the multi-layered portion 96. The multi-layered wiring portion 96 includes a first wiring portion 22 on the bottom side to an n-th wiring portion 82 on the top side.

Multiple element isolation regions 8 which are trenches 5 filled with insulators are formed in the silicon substrate 101. The element isolation regions 8 define an element formation region 9. The inter-layer film 95 includes a first inter-layer film 11, a local wiring layer 12, and a second inter-layer film 13, which are deposited on the silicon substrate 101 in this order.

MOS transistors (hereinafter, semiconductor elements) 102 are formed on the silicon substrate 101 in the element formation region 9. An insulating film 3 having a flat upper surface is formed over the silicon substrate 101 to cover the semiconductor elements 102. Multiple via holes 6 are formed in the insulating film 3 adjacent to the semiconductor elements 102.

The local wiring layer 12 covers the entire first inter-layer film 11. Although not shown, capacitors, local wires, or the like are formed in the local wiring layer 12. The local wires are connected to the via holes 6.

An insulating film 1 having a flat upper surface covers the local wiring layer 12. Multiple through holes are formed to penetrate the insulating film 1. A material, such as a metal, fills the through holes to form contact plugs 2. The insulating film 1 and the contact plugs 2 form the second inter-layer film 13. The contact plugs are connected to the local wires.

The multi-layered wiring portion 96 includes n wiring layers from a first wiring layer 20 on the bottom to an n-th wiring layer 80 on the top. The first wiring layer 20 is formed on the second inter-layer film 13. The first wiring layer 20 includes multiple first wiring portions 22, a first pad portion 23, and air gaps.

The first wiring portions 22 are connected to the contact plugs 2. The first wiring portion 22 has a line shape extending in a direction perpendicular to the paper of FIG. 1. The shorter width of the first wiring portion 22 is shown in FIG. 1. The first pad 23 is electrically insulated from the first wiring portion 22 and the contact plug 2.

A second wiring layer 30 is formed over the first wiring layer 20. The second wiring layer 30 includes multiple second wiring portions 32, a second pad 33, and air gaps. The second wiring portion 32 is connected to the first wiring portion 22 through a contact plug 32b. The second pad 33 is connected to the first pad 23 through a contact plug 33b.

A third wiring layer 40 is formed over the second wiring layer 30. The third wiring layer 40 includes multiple third wiring portions 42, a third pad 43, and air gaps. The third wiring portion 42 is connected to the second wiring portion 32 through a contact plug 42b. The third pad 43 is connected to the second pad 33 through a contact plug 43b.

Although not shown, a fourth wiring layer to an (n−2)-th wiring layer 60 are sequentially deposited in a similar manner as the second and third wiring layers 30 and 40. The (n−2)-th wiring layer 60 includes multiple (n−2)-th wiring portions 62, an (n−2)-th pad 63, and air gaps. The (n−2)-th wiring portion 62 is connected to an (n−3)-th wiring portion through a contact plug 62b. The (n−2)-th pad 63 is connected to an (n−3)-th pad through a contact plug (not shown).

An (n−1)-th wiring layer 70 is formed over the (n−2)-th wiring layer 60. The (n−1)-th wiring layer 70 includes multiple (n−1)-th wiring portions 72, an (n−1)-th pad 73, and air gaps. The (n−1)-th wiring portion 72 is connected to an (n−2)-th wiring portion 62 through a contact plug 72b. The (n−1)-th pad 73 is connected to an (n−2)-th pad 63 through a contact plug 73b.

An n-th wiring layer 80 is formed over the (n−1)-th wiring layer 70. The n-th wiring layer 80 includes multiple n-th wiring portions 82 and air gaps. The n-th wiring portion 82 shown in FIG. 1 has a line shape extending in the direction parallel to the sheet of FIG. 1. In other words, the longitudinal width of the n-th wiring portion 82 is shown in FIG. 1. The n-th wiring portion 82 is connected to the (n−1)-th wiring portions 72 and the (n−1)-th pad 73 through contact plugs 82b.

The second wiring layer 30 to the (n−1)-th wiring layer 70 form a connected wiring layer 92. The connected wiring layer 92 includes: connected wiring portions 53 and 54 that connect the n-th wiring portion 82 and the first wiring portion 22; a cylindrical supporter 51 that is made of the same material as a material forming the connected wiring portions 53 and 54, supports the n-th wiring portion 82 from the side of the inter-layer film 95, and is electrically insulated from the first wiring portion 22; and air gaps 96c defined by the first and n-th wiring portions 22 and 82, the cylindrical supporter 51, and the connected wiring portions 53 and 54.

The cylindrical supporter 51 includes the first pad 23 to the (n−1)-th pad 73 deposited in this order. Thus, the supporter 51 supports the n-th wiring portion 82 from the side of the inter-layer film 95, thereby reducing a deflection of the n-th wiring portion 82.

The cylindrical supporter 51 is electrically insulated from the first to (n−1)-th wiring portions 22 to 72. Thus, the cylindrical supporter 51 does not affect the semiconductor element 102.

The shape of the cylindrical supporter 51 is not limited thereto, and may be rectangular, columnar, or the like. The number of the cylindrical supporter 51 supporting the n-th wiring portion 82 is not limited to one as shown in FIG. 1. Multiple cylindrical supporters 51 may be provided to support the n-th wiring portion 82. The number of the supporters 51 necessary for reducing a deflection of the n-th wiring portion 82 varies depending on the size of the n-th wiring portion 82, the number of sagged portions, and the distance between the first and n-th wiring portions 22 and 82.

For example, the first pad 23 may be widened so that two second pads 33 are provided on both end portions of the first pad 23 in the width direction, thereby forming two cylindrical supporters. Thus, the n-th wiring portion 82 can be more-strongly supported.

Alternatively, multiple cylindrical supporters 51 may be provided in the longitudinal direction of the n-th wiring portion 82. In this case, the distance between the cylindrical supporter 51 and the connected wiring portion 53 or the distance between the cylindrical supporter 51 and the connected wiring portion 54 is preferably set to 1.5 mm or less, thereby preventing the n-th wiring portion 82 from sagging and contacting the first wiring portion 22. Preferably, the cylindrical supporter 51 is positioned in substantially the center between the connected wiring portions 53 and 54 to stably support the n-th wiring portion 82.

The position of the cylindrical supporter 51 with respect to the n-th wiring portion 82 in the longitudinal direction of the n-th wiring portion 82 was determined based on the relationship between the length of the copper wire and the maximum deflection degree which is obtained by a dynamical calculation. The maximum deflection degree is a value measured in the center of the copper wire sagged under its own weight while both ends of the copper wire are supported by contact plugs.

Figure 2:
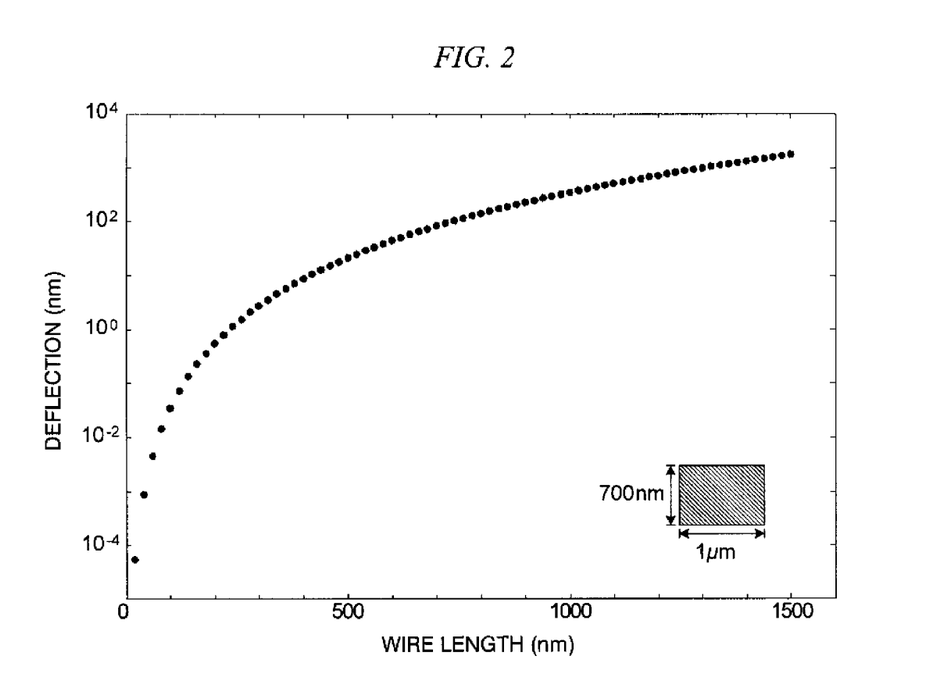
FIG. 2 is a graph illustrating the relationship between the length of a copper wire and the maximum deflection degree.

FIG. 2 is a graph illustrating the relationship between the length of the copper wire and the maximum deflection degree obtained by the calculation when the copper wire having a thickness of 1 μm and a height of 700 nm was used.

As shown in FIG. 2, when the copper wire length increases up to 1.5 mm (1500 nm), the maximum deflection degree sharply increases in a range of the wire length from 10 nm to 300 nm, and gradually increases at a constant rate in a range of the wire length from 300 nm. When the wire length was 1.5 mm, the maximum deflection degree became approximately 500 nm, which was the deflection degree at which the copper wire almost contacted the first wiring portion.

When the cylindrical supporter 51 was added to halve the actual wire length, the maximum deflection degree was reduced to 30 nm or less. In other words, when the distance between the connected portions 53 and 54 is 1.5 mm or more, the n-th wiring portion 82 sags under its own weight, thereby causing the first and n-th wiring portions 22 and 82 to short out, or the n-th wiring portion 82 to fracture.

However, when the distance between the connected portions 53 and 54 is 1.5 mm or less, the deflection degree of the n-th wiring portion 82 is small, and therefore the first and n-th wiring portions 22 and 82 do not contact each other.

As shown in FIG. 1, the connected wiring portions 53 and 54 each including the second wiring portion 32 to the (n−1)-th wiring portion 72 are formed to connect the first wiring portion 22 and n-th wiring portion 82.

In the connected wiring portions 53 and 54, the second wiring portion 22 to the (n−1)-th wiring portions 72 are not formed vertically straight as the cylindrical supporter 51, but formed by drawing wires in each layer. For this reason, any one of the n-th wiring portions 82 can be easily connected to any one of the first wiring portions 22.

As shown in FIG. 1, the air gap 96c is defined by the first and n-th wiring portions 22 and 82, and the connected wiring portions 53 and 54. Multiple air-gaps included in respective layers forming the multi-layered wiring portion 96 form the air gap 96c. The air gap 96c insulates the first wiring portion 22, the n-th wiring portion 82, and the connected wiring portions 53 and 54 from one another, thereby reducing capacities among wiring portions.

The connected wiring portions 53 and 54 and the cylindrical supporter 51 are made of a high-conductivity material. For example, a metal such as Cu or Al, or an alloy including these metals can be used. Additionally, a material for securing selectivity of wet-etching of an insulating film is preferably used.

Further, the connected wiring portions 53 and 54 and the cylindrical supporter 51 are preferably made of the same material so that the connected wiring portions 53 and 54 and the cylindrical supporter 51 can be collectively formed, thereby enabling simplification of the process of manufacturing the semiconductor device.

The bonding pad 98 is formed on the n-th wiring layer 80. Another bonding pad (not shown) is connected onto the first wiring portion 22. A voltage is applied between the two bonding pads for a current to flow, thereby making the semiconductor device 102 to operate.

Hereinafter, a method of manufacturing the semiconductor device 111 according to the first embodiment is explained. FIGS. 3 to 6 are cross-sectional views indicative of a process flow illustrating the method of manufacturing the semiconductor device 111 according to the first embodiment. Like reference numerals denote like elements between FIG. 1 and FIGS. 3 to 6.

The method includes: forming the inter-layer film 95; forming the first to n-h wiring layers 20 to 80; and forming air gaps.

Figure 3:
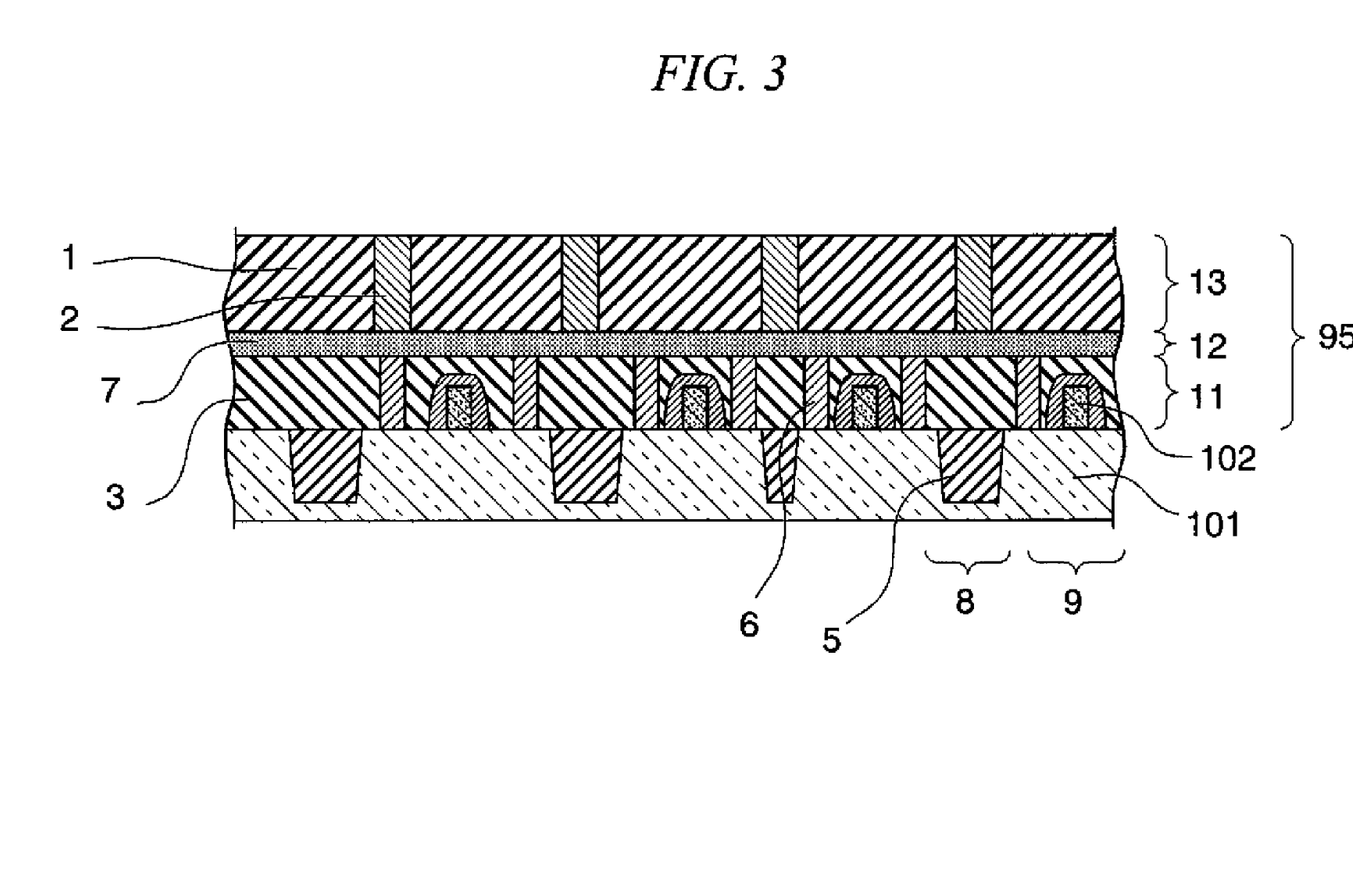
FIGS. 3 to 6 are cross-sectional views indicative of a process flow illustrating a method of manufacturing the semiconductor device according to the first embodiment.

Hereinafter, the process of forming the inter-layer film 95 is explained first. FIG. 3 is a cross-sectional view illustrating the state when the inter-layer film 95 has been formed.

First, the trenches 5 are formed in the silicon substrate 101. Then, the trenches 5 are filled with insulators to form the element isolation regions 8, and thereby the element formation region 9 is defined by the element isolation regions 8. Then, the semiconductor elements 102, such as MOS transistors, are formed in the element formation region 9. Then, the insulating film 3 is formed to cover the semiconductor elements 102, thereby forming the first inter-layer film 11. Then, the local wiring layer 12 including a capacitor, a local wire, and the like is formed on the first inter-layer film 11. Then, the insulating film 1 is formed to cover the local wiring layer 12. Then, the contact plugs 2 are formed to penetrate the insulating film 1, thereby forming the second inter-layer film 13. In this manner, the inter-layer film 95 is formed on the substrate 101.

Figure 4:
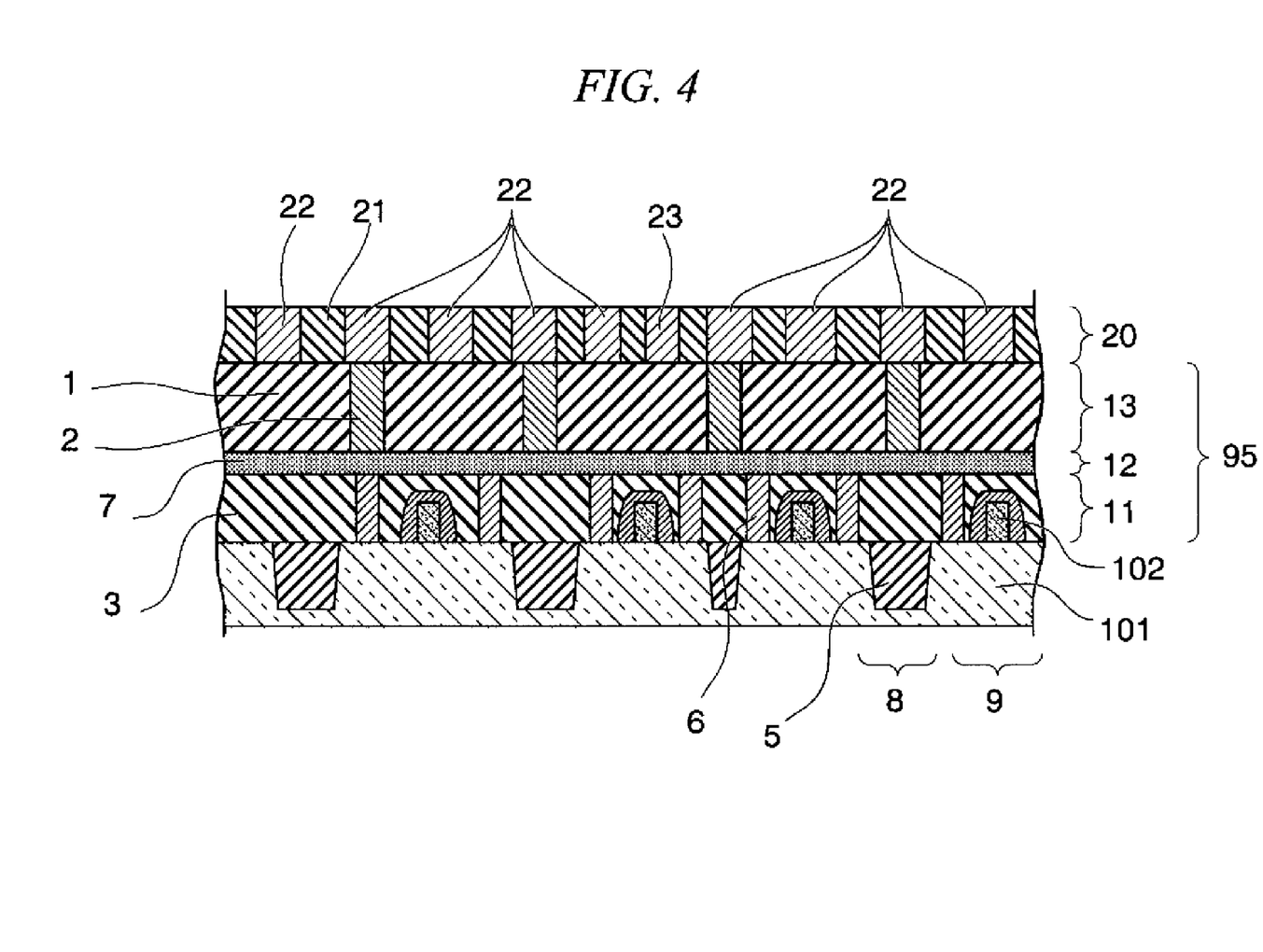

The process of forming the first wiring layer 20 includes forming, on the inter-layer film 95, the first wiring layer 20 including the first wiring portions 22, the first pad 23, and a first insulating film 21. The first wiring layer 20 is formed by a single damascene process.

First, the first insulating film 21 is formed on the insulating film 1. Then, grooves and pad-shaped openings are formed by lithography and dry-etching in the first insulating film 21 so as not to contact each other. Then, the grooves and the openings are filled with a wiring material, such as Cu, by a plating process at the same time. Then, an upper surface of the first insulating film 21 is planarized by CMP (Chemical Mechanical Polishing), thereby forming the first wiring layer 20.

FIG. 4 illustrates a cross-sectional view illustrating the state when the first wiring layer 20 has been formed. The grooves and the openings filled with the wiring material become the first wiring portion 22 and the first pad 23, respectively.

The damascene process is a technique of forming wires by embedding a metal or the like into a groove or an opening formed in an insulating film. For example, a groove is formed in a silicon substrate, a metal is vapor-deposited to fill the groove, and them a surface of the metal is chemically polished, thereby forming wires.

The damascene process includes a single damascene process and a dual-damascene process. In the single damascene process, a plug metal and a wire metal are separately embedded in two steps. In the dual damascene process, a plug metal and a wire metal are embedded at the same time.

Figure 5:
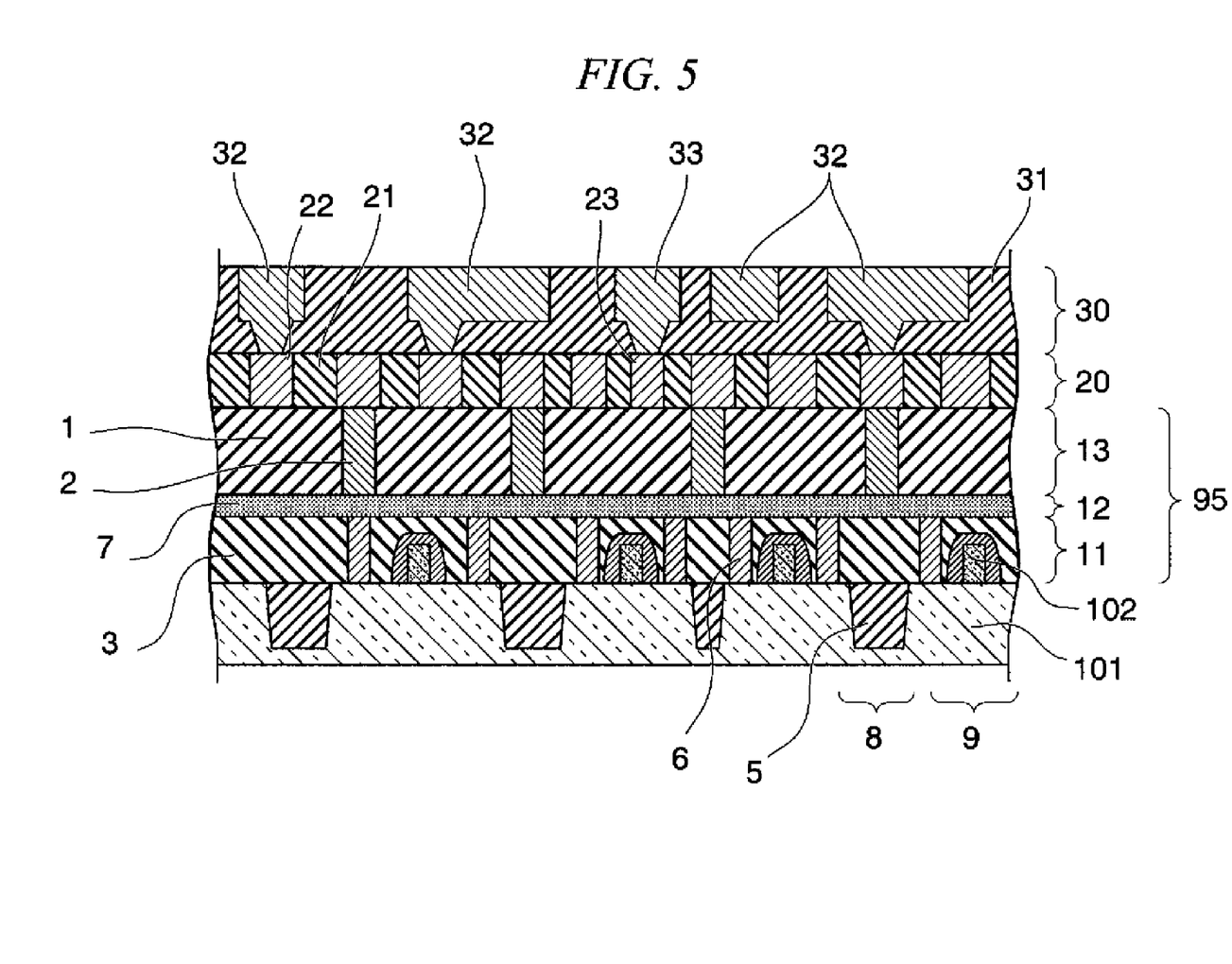

The process of forming the second wiring layer is a process of forming, on the first wiring layer 20, the second wiring layer 30 including the second wiring portion 32, the second pad 33, and a second insulating film 31. The second wiring layer 30 is formed by the dual damascene process.

First, the second insulating film 31 is formed on the first wiring layer 20. Then, grooves and pad-shaped openings are formed by lithography and dry-etching in the second insulating film 31 so as not to contact each other. The groove is provided with a hole to partially expose an upper surface of the first wiring portion 22. The opening is provided with a hole to partially expose an upper surface of the first pad 23.

Then, the grooves and the openings are simultaneously filled with a wiring material, such as Cu. Then, an upper surface of the second insulating film 31 is planarized by CMP, thereby forming the second wiring layer 30.

FIG. 5 is a cross-sectional view illustrating the second wiring layer 30 when the second wiring layer 30 has been formed. The wiring material filled in the groove becomes the second wiring portion 32. The wiring material filled in the opening becomes the second pad 33. The wiring material filled in the hole of the groove becomes the contact plug 32b. The wiring material filled in the hole of the opening becomes the contact plug 33b.

Then, the third to (n−1)-th wiring layers 40 to 70 are formed by the dual damascene process in a similar manner. The process of forming the second to (n−1)-th wiring layers is the process of forming the connected wiring layer 92. Thus, the connected wiring layer 92 including the connected wiring portions 53 and 54, the cylindrical supporter 51 electrically insulated from the first wiring portion 22, and the insulating films 31, 41, 61, and 71 is formed on the first wiring layer 20.

Figure 6:
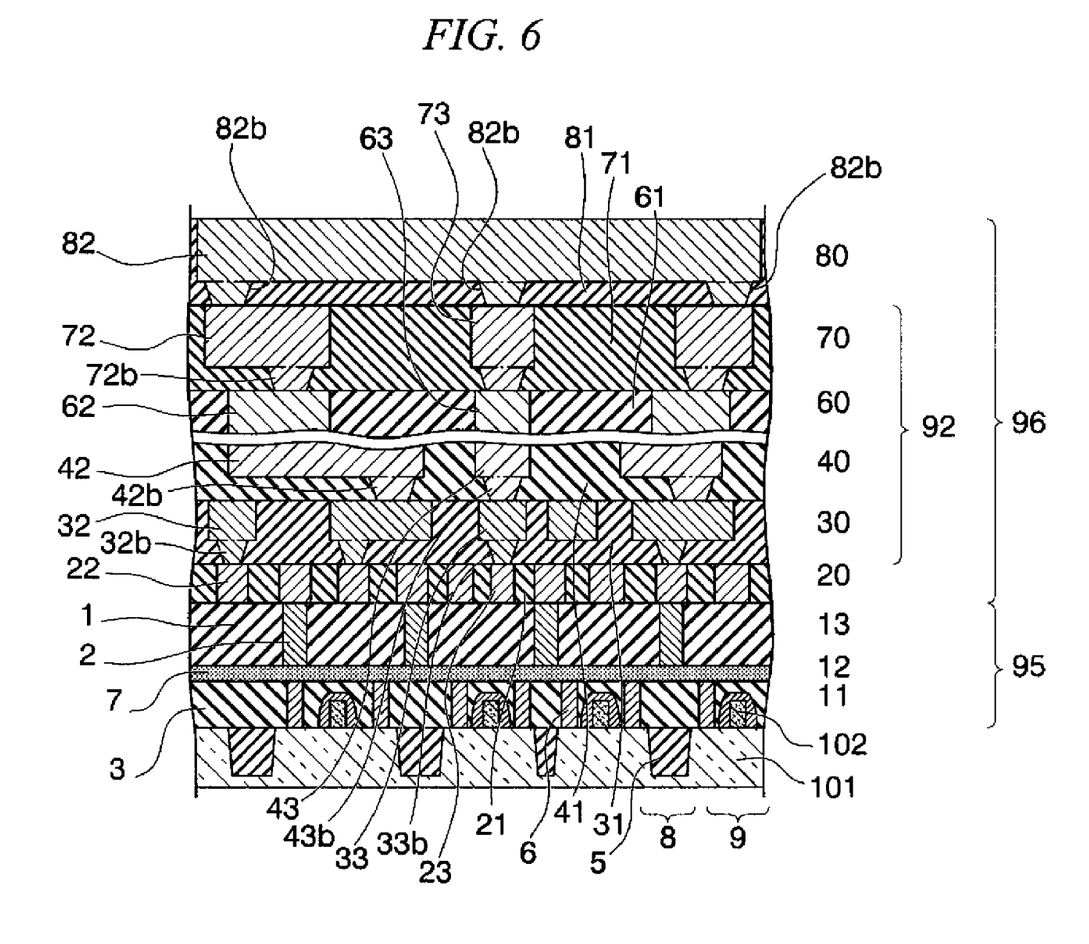

The process of forming the n-th wiring layer 80 is the process of forming, on the (n−1)-th wiring layer 70, the n-th wiring layer 80 including the n-th wiring portions 82 and an n-th insulating film 81 by dual damascene process.

First, the n-th insulating film 81 is formed on the (n−1)-th wiring layer 70. Then, grooves are formed in the n-th insulating film 81 so as not to contact each other by lithography and dry-etching. Each of the grooves is provided with a hole to partially expose an upper surface of the (n−1)-th wiring portion 72 and a hole to partially expose an upper surface of the (n−1)-th pad 73.

Then, the grooves and the holes are filled with a wiring material, such as Cu, by a plating process. Then, an upper surface of the n-th insulating film 81 is planarized by CMP, thereby forming the n-th wiring layer 80.

FIG. 6 is a cross-sectional view illustrating the n-th wiring layer 80 when the n-th wiring layer 80 has been formed. The wiring material filled in the groove becomes the n-th wiring portion 82. The wiring material filled in the holes becomes the contact plugs 82b.

Then, the bonding pad 98 is formed on the n-th wiring layer 82 by a known technique.

The process of forming the air gaps includes removing the first to n-th insulating films 21 to 81 to form the air gap 96c in the multi-layered wiring portion 96. Preferably, this process is carried out by wet-etching. Thus, the insulating films are completely removed even if the air gap 96 has a complicated shape.

Although not shown, an etching stopper layer made of a material different from that forming the first to n-th insulating films 21 to 81 is formed before the formation of the first wiring layer 20. Accordingly, the first to n-th insulating films 21 to 81 can be removed without removing the insulating films 1 and 3 included in the inter-layer film 95. Specifically, an etching stopper layer made of a silicon nitride film is formed, and then the first to n-th insulating films 21 to 81 made of a silicon oxide film are formed.

Thus, the semiconductor device 111 shown in FIG. 1 is formed.

According to the semiconductor device 111 of the first embodiment, the cylindrical supporter 51 supports the wiring portion 82. Therefore, even if a long wire having a length of 1 mm or more is used for the wiring portion 82, a deflection of the wiring portion 82 is reduced, thereby preventing a short caused by the first and n-th wiring portions 22 and 82 contacting each other, and therefore preventing the long wire to fracture.

According to the method of manufacturing the semiconductor device 111 of the first embodiment, the connected wiring portions 53 and 54 and the cylindrical supporter 51 are simultaneously formed by a dual damascene process, thereby simplifying the manufacturing process. Additionally, the air gap 96c is formed by wet-etching, thereby easily and completely removing the insulating films even if the air gap 96 has a complicated shape.

Second Embodiment

Figure 7:
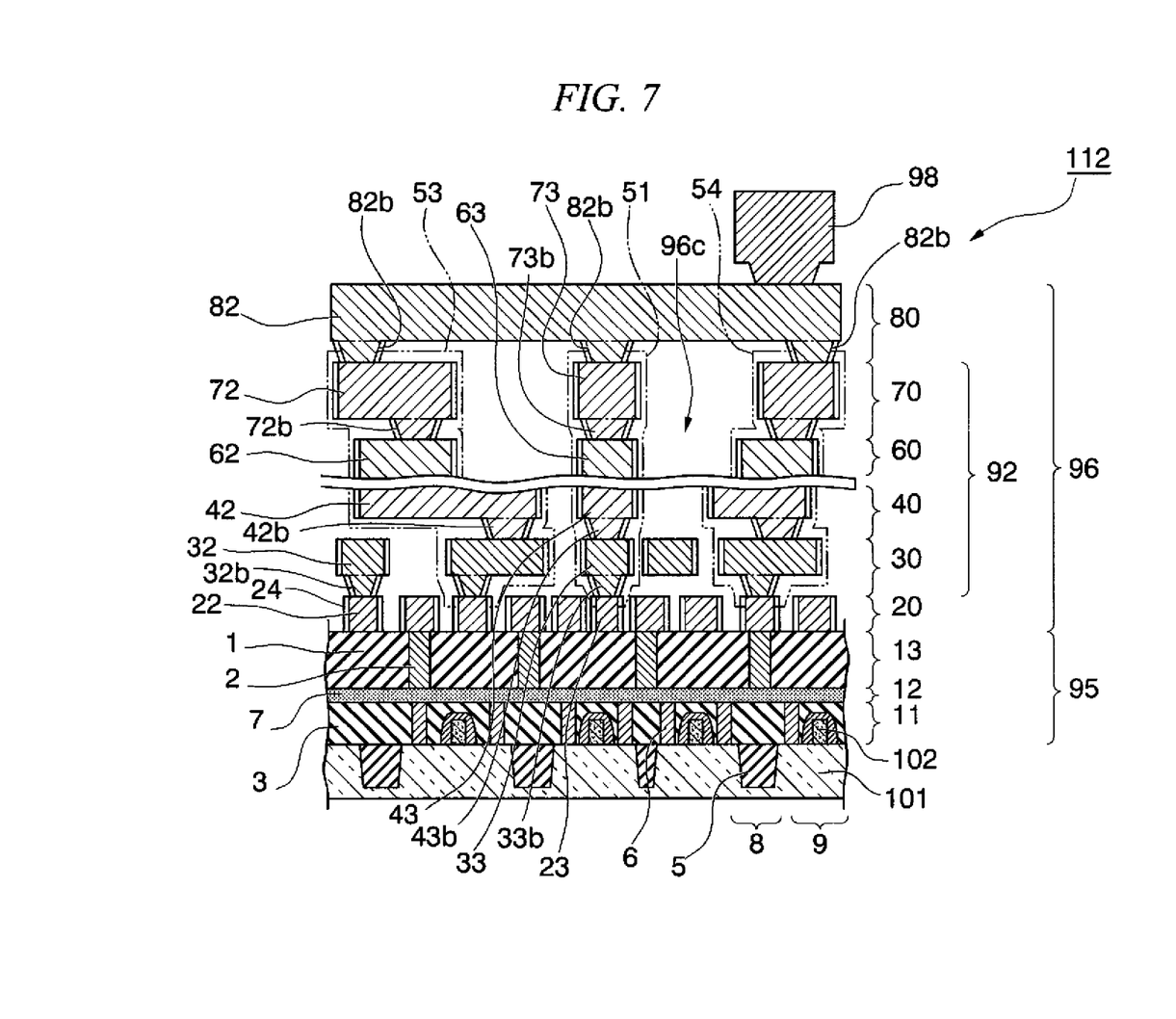
FIG. 7 is a cross-sectional view illustrating a semiconductor device according to a second embodiment of the present invention.

FIG. 7 is a cross-sectional view illustrating a semiconductor device 112 according to a second embodiment of the present invention. The semiconductor device 112 has a similar structure to that of the semiconductor device 111 of the first embodiment except that reinforcement thin films 24 are formed to cover the side surfaces of the connected wiring portions 53 and 54, and the cylindrical supporter 51. Like reference numerals denote like elements between the first and second embodiments.

Preferably, the reinforcement thin film 24 is made of a material having a higher Young's modulus (hereinafter, "reinforcement material") than that of the wiring material to enhance the strength of the connected wiring portions 53 and 54, and the cylindrical supporter 51.

The Young's modulus is a kind of elastic modulus and indicates stiffness characteristics of a material with respect to forces of compression and tension. The Young's modulus is also called elastic modulus in tension. For example, the Young's modulus of Cu is 110 GPa to 130 GPa. The Young's modulus of an aluminum plating is 69 GPa.

Although the reinforcement thin films 24 are formed to cover the side surfaces of the connected wiring portions 53 and 54 and the cylindrical supporter 51, the present invention is not limited thereto. Alternatively, the reinforcement thin films 24 may be formed to cover the upper surface of the first wiring portion 22 or the lower surface of the n-th wiring portion 82. Further, the reinforcement thin film 24 may be formed on only one surface or each of multiple surfaces.

Preferably, a material having a density smaller than that of the wiring material is used for the reinforcement material in order to lighten the multi-layered wiring portion 96, and therefore the entire semiconductor device 112.

Hereinafter, a method of manufacturing the semiconductor device 112 according to the second embodiment is explained. The method of the second embodiment is the same as the method of the first embodiment except that a process of forming the reinforcement thin films 24 is added to the process of forming the multi-layered wiring portion 96. Therefore, only the process of forming the multi-layered wiring portion 96 is explained hereinafter. The process of forming the multi-layered wiring portion 96 includes forming the first to n-th wiring layers, as follows.

The process of forming the first wiring layer 20 is a process of forming, on the inter-layer film 95 by a single damascene process, the first wiring layer 20 including the reinforcement thin film 24, the first wiring portions 22, the first pad 23, and the first insulating film 21.

First, the first insulating film 21 is formed on the insulating film 1. Then, grooves and pad-shaped openings are formed so as not to contact each other in the first insulating film 21 by lithography and dry-etching.

Then, a reinforcement thin film made of a given metal is formed to cover at least inner side surfaces of the grooves and the openings by sputtering or vapor deposition. Then, the grooves and the openings are simultaneously filled with a wiring material, such as Cu, by a plating process. Then, an upper surface of the first insulating film 21 is planarized by CMP to form the first wiring layer 20. By the CMP, the reinforcement thin film covering the upper surface of the first insulating film 21 is removed.

The wiring material filled in the groove becomes the first wiring portion 22. The wiring material filled in the opening becomes the first pad 23. The side surfaces of the first wiring portion 22 and the first pad 23 are covered by the reinforcement thin film 24.

Then, the second to (n−1)-th wiring layers are formed similarly to the first embodiment except that reinforcement thin films are formed to cover inner surfaces of grooves and openings by sputtering or vapor deposition before filling a wiring material, such as Cu, into the grooves and the openings by a plating process. Similarly to the first embodiment, the grooves and the openings are provided with holes for contact plugs.

Then, the n-th wiring layer is formed similarly to the first embodiment except that a reinforcement thin film is formed to cover inner surfaces of grooves and holes by spattering and vapor deposition before filling a wiring material, such as Cu, into the grooves and the holes by a plating process. Thus, the reinforcement thin film 24 is formed to cover the side surfaces of the contact 82b in the n-th wiring layer 82.

In this manner, the semiconductor device 112 including the reinforcement thin film 24 covering the side surfaces of the connected wiring portions 53 and 54 and the cylindrical supporter 51.

In the process of forming the second wiring layer 30, the reinforcement thin film 24 can be formed by spattering or vapor deposition on the upper surface of the second wiring layer 30 after filling a wiring material, such as Cu, into the grooves and the openings by a plating process. Similarly, the reinforcement thin film 24 can be formed in the third to (n−1)-th wiring layers.

Additionally, the n-th wiring layer is formed similarly to the first embodiment except that a reinforcement thin film is formed to cover the bottom surface of the grooves by spattering and vapor deposition before filling a wiring material, such as Cu, into the grooves and the holes by a plating process. Thus, the reinforcement thin film 24 is formed to cover the bottom surface of the n-th wiring layer 82.

According to the semiconductor device 112 of the second embodiment, the wiring portions, the contact plugs, and the supporter 51 are partially covered by the reinforcement thin films 24 made of a material having a Young's modulus higher than that of the wiring material. Thereby, deflection of wiring portions are reduced, and therefore the semiconductor device 112 can be strengthened. Further, the wiring portions are strengthened by the reinforcement thin films 24, thereby enabling a reduction in the number of the cylindrical supporters 51, and therefore simplifying the manufacturing process.

Further, the reinforcement material has a density smaller than that of the wiring material, thereby reducing deflection of the wiring portions. Therefore, the semiconductor device 112 having a multi-layered structure including air gaps can be strengthened and lightened.

Hereinafter, examples of the present invention are explained. The present invention is not limited to the following examples.

Example 1

A semiconductor device 101 including eight wiring layers as shown in FIG. 1 while Cu was used as the wiring material was manufactured using the manufacturing method of the first embodiment. The semiconductor device 101 having a multi-layered wiring structure including air gaps with reduced deflection of the eighth wiring portion could be easily manufactured. A given evaluation process proved that there was no short of the upper and lower wiring portions and a fracture of the eighth wiring portion.

Example 2

A semiconductor device 102 including eight wiring layers as shown in FIG. 1 was manufactured similarly to the first example except that Al was used as the wiring material. The semiconductor device 102 having a multi-layered wiring structure including air gaps with reduced deflection of the eighth wiring portion could be easily manufactured. A given evaluation process proved that there was no short of the upper and lower wiring portions and a fracture of the eighth wiring portion.

Example 3

A semiconductor device 103 including eight wiring layers as shown in FIG. 2 while Al and Cu were used as the wiring material and the reinforcement material, respectively, was manufactured using the manufacturing method of the second embodiment. The semiconductor device 103 having a multi-layered wiring structure including air gaps with reduced deflection of the eighth wiring portion could be easily manufactured. A given evaluation process proved that there was no short of the upper and lower wiring portions and a fracture of the eighth wiring portion.

The present invention is applicable to semiconductor device manufacturing industries.

It is apparent that the present invention is not limited to the above embodiments, but may be modified and changed without departing from the scope and spirit of the invention.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

What is claimed is:

1. A semiconductor device, comprising:
    a first layer;
    a second layer above the first layer;
    a first multi-layered structure;
    a second multi-layered structure, the first and second multi-layered structures extending from the first layer to connect to the second layer;
    a supporter extending from the first layer to connect to the second layer, the supporter being between the first and second multi-layered structures, the supporter being separated from the first and second multi-layered structures by empty space;
    a first contact plug in the first layer, the first contact plug penetrating through the first layer, the first contact plug being electrically connected to the first multi-layered structure; and
    a second contact plug in the first layer, the second contact plug penetrating through the first layer, the second contact plug being electrically connected to the second multi-layered structure,
    wherein the supporter is electrically insulated from the first and second contact plugs.

2. The semiconductor device according to claim 1, wherein the first multi-layered structure comprising a plurality of third layers; the second multi-layered structure comprising a plurality of fourth layers; and the supporter comprises a plurality of fifth layers, the plurality of fifth layers being stacked in one straight line vertical to the plurality of fifth layers.

3. The semiconductor device according to claim 2, further comprising:
    a plurality of first contact plugs connecting the second layer to the first and second multi-layered structures and to the supporter;
    a plurality of second contact plugs connecting the plurality of third layers;
    a plurality of third contact plugs connecting the plurality of fourth layers; and a plurality of fourth contact plugs connecting the plurality of fifth layers in the one straight line.

4. The semiconductor device according to claim 3, wherein the first to fifth layers, and the plurality of first to fourth contact plugs are made of a first material.

5. The semiconductor device according to claim 4, further comprising:
a plurality of thin films satisfying first to third conditions, the first condition being that the plurality of thin films cover side surfaces of the plurality of third and fourth layers, the second condition being that the plurality of thin films cover side surfaces of the plurality of fifth layers, and the third condition being that the plurality of thin films cover side surfaces of the first to fourth contact plugs.

6. The semiconductor device according to claim 5, wherein the first material has a first Young's modulus, the plurality of thin films are made of a second material having a second Young's modulus, and the second Young's modulus is greater than the first Young's modulus.

7. The semiconductor device according to claim 6, wherein the second material has a lower density than the first material.

* * * * *